(12) United States Patent
Shew

(10) Patent No.: US 9,152,036 B2
(45) Date of Patent: Oct. 6, 2015

(54) X-RAY MASK STRUCTURE AND METHOD FOR PREPARING THE SAME

(71) Applicant: NATIONAL SYNCHROTRON RADIATION RESEARCH CENTER, Hsinchu (TW)

(72) Inventor: Bor Yuan Shew, Hsinchu (TW)

(73) Assignee: NATIONAL SYNCHROTRON RADIATION RESEARCH CENTER, Hsinchu (TW)

( * ) Notice: Subject to any disclaimer, the term of this patent is extended or adjusted under 35 U.S.C. 154(b) by 0 days.

(21) Appl. No.: 14/081,529

(22) Filed: Nov. 15, 2013

(65) Prior Publication Data
US 2015/0085974 A1 Mar. 26, 2015

Related U.S. Application Data

(60) Provisional application No. 61/881,152, filed on Sep. 23, 2013.

(51) Int. Cl.
*G03F 7/20* (2006.01)
*H01L 21/308* (2006.01)
*G03F 1/22* (2012.01)

(52) U.S. Cl.
CPC ........................................ *G03F 1/22* (2013.01)

(58) Field of Classification Search
CPC ........... G03F 1/22; G03F 1/20; G03F 7/0002; H01L 33/58; G21K 1/10; G21K 1/062; Y10S 430/168; Y10S 430/167
USPC .......... 378/35, 34, 161, 145; 430/5, 967, 322, 430/323, 324, 966; 216/12, 2, 13, 99; 250/492.2, 505.1, 503.1; 372/103
See application file for complete search history.

(56) References Cited

U.S. PATENT DOCUMENTS

| | | | | |
|---|---|---|---|---|
| 3,742,230 A | * | 6/1973 | Spears et al. | 378/35 |
| 3,873,824 A | * | 3/1975 | Bean et al. | 378/35 |
| 4,393,127 A | * | 7/1983 | Greschner et al. | 430/5 |

(Continued)

FOREIGN PATENT DOCUMENTS

| | | |
|---|---|---|
| DE | 3900526 | 7/1989 |
| EP | 0212713 | 3/1987 |

(Continued)

OTHER PUBLICATIONS

"Layered X-Ray Mask Substrate," IBM Technical Disclosure Bulletin, vol. 27, No. 11, Apr. 1, 1985, pp. 6615-6616, XP001392174.

(Continued)

*Primary Examiner* — David A Vanore
(74) *Attorney, Agent, or Firm* — Hamre, Schumann, Mueller & Larson, P.C.

(57) ABSTRACT

An X-ray mask structure includes a unibody support substrate having at least one thinned portion surrounded by a wall portion, a top layer disposed on the at least one thinned portion of the support substrate, and a plurality of X-ray absorber patterns disposed on the top layer over the at least one thinned portion. The top layer and the at least one thinned portion form a laminated membrane, wherein the at least one thinned portion and the wall portion provide mechanical support for the top layer, and the laminated membrane provides mechanical support for the plurality of X-ray absorber patterns.

27 Claims, 10 Drawing Sheets

(56) References Cited

U.S. PATENT DOCUMENTS

| | | | |
|---|---|---|---|
| 4,870,648 A * | 9/1989 | Ceglio et al. | 372/5 |
| 5,258,091 A * | 11/1993 | Imai et al. | 216/12 |
| 5,273,829 A * | 12/1993 | Bassous et al. | 428/446 |
| 5,700,603 A * | 12/1997 | Lee | 430/5 |
| 5,756,237 A * | 5/1998 | Amemiya | 430/5 |
| 5,878,105 A * | 3/1999 | Jeon et al. | 378/35 |
| 5,958,631 A * | 9/1999 | Acosta et al. | 430/5 |
| 6,387,574 B1 * | 5/2002 | Amemiya | 430/5 |
| 6,583,062 B1 * | 6/2003 | Ma et al. | 438/700 |
| 7,582,393 B2 | 9/2009 | Sano et al. | |
| 2002/0028396 A1 | 3/2002 | Surendra et al. | |
| 2005/0023145 A1* | 2/2005 | Cohen et al. | 205/118 |
| 2010/0285412 A1* | 11/2010 | Shew | 430/324 |
| 2012/0100719 A1* | 4/2012 | Constancias et al. | 438/694 |
| 2014/0151733 A1* | 6/2014 | Koike et al. | 257/98 |

FOREIGN PATENT DOCUMENTS

| | | |
|---|---|---|
| EP | 0266275 | 12/1993 |
| EP | 0323263 | 3/1995 |
| JP | 53-17075 | 2/1978 |
| JP | 54-89482 | 7/1979 |
| JP | 55-157739 | 12/1980 |
| JP | 58-82522 | 5/1983 |
| JP | 63-137423 | 6/1988 |
| JP | 63-293820 | 11/1988 |
| JP | 03-289122 | 12/1991 |
| JP | 07-220992 | 8/1995 |
| JP | 10-88385 | 4/1998 |
| JP | 2000-182944 | 6/2000 |
| JP | 2004-235295 | 8/2004 |
| TW | 200417813 | 9/2004 |
| WO | 2004/062899 | 7/2004 |

OTHER PUBLICATIONS

"X-Ray Lithography Mask With Visible Light Transmitting Areas," IBM Technical Disclosure Bulletin, vol. 32, No. 5A, Oct. 1, 1989, pp. 240-241, XP000048902, ISSN: 0018-8689.

Brunger et al., "Influence of thin film thickness variations on pattern fidelity of X-ray masks," Microelectronic Engineering, vol. 5, No. 1-4, Dec. 1, 1986, pp. 61-65.

Office Action issued Feb. 24, 2015 in corresponding Japanese patent application, 5 pages total (English language summary translation provided).

Office Action issued May 15, 2015 in corresponding Korean patent application and English language summary translation, 10 pages total.

Ko et al., "Micrograting fabricated by deep x-ray lithography for optical communications," Optical Engineering, vol. 46, issue 4, pp. 048001-1-048001-7 (Apr. 2007).

Decision to Grant issued Jul. 14, 2015 in corresponding Japanese patent application, 3 pages total.

* cited by examiner

X-RAY MASK STRUCTURE AND METHOD FOR PREPARING THE SAME

TECHNICAL FIELD

The present disclosure relates to an X-ray mask structure with high precision and high rigidity and a method for preparing the same.

DISCUSSION OF THE BACKGROUND

Various lithography techniques have been recently developed to provide fine patterning of micro/nano devices with light rays, electron beams and X-rays. Among them, X-ray lithography is receiving a great deal of attention as a technique which can provide fine structure with high aspect ratio. An important element in an X-ray lithographic system is the provision of a suitable mask which comprises an X-ray transparent support substrate having a pattern of X-ray absorbers formed thereon. Various materials have been suggested for the mask support substrate, which must be relatively transmissive to X-rays.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides an X-ray mask structure with high precision and high rigidity and a method for preparing the same.

A method for preparing an X-ray mask structure with high precision and high rigidity according to this aspect of the present disclosure comprises steps of providing a support substrate having a top surface and a bottom surface, forming a top layer on the top surface and a bottom layer having an aperture on the bottom surface, removing a portion of the support substrate through the aperture of the bottom layer to form at least one thinned portion of the support substrate, and forming a plurality of X-ray absorber patterns on the top layer over the at least one thinned portion.

An X-ray mask structure according to this aspect of the present disclosure comprises a unibody support substrate having at least one thinned portion surrounded by a wall portion, a top layer disposed on the at least one thinned portion of the support substrate, and a plurality of X-ray absorber patterns disposed on the top layer over the at least one thinned portion. The top layer and the at least one thinned portion form a laminated membrane, wherein the at least one thinned portion and the wall portion provide mechanical support for the top layer, and the laminated membrane provides mechanical support for the plurality of X-ray absorber patterns.

The thinned portion and the wall portion form the unibody support substrate, which can provide mechanical support for the top layer. By contrast, if the etching process forms a depression that penetrates through the support substrate, i.e., if there is no thinned portion below the top layer, the wall portion alone may not be able to provide enough mechanical support for the top layer. As a result, without the thinned portion, the top layer supported by the wall portion alone is very fragile due to its residual stress and growth defects. In other words, the X-ray mask structure of the present disclosure has an increased rigidity due to the thinned portion and the wall portion of the unibody support substrate.

The thinned portion of the unibody support substrate can provide a very stable mechanical property, and the top layer can provide excellent chemical resistance and a strengthened mechanical property. In practice, the yield and rigidity of the laminated membrane is at least one order higher than that of single-layer membrane. Furthermore, in the X-ray mask structure of the present disclosure, the increased mechanical support of the laminated membrane allows the X-ray absorber patterns thereon to be formed with increased thickness, which can provide increased precision of transferred patterns in X-ray lithography.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to an X-ray mask structure with high precision and high rigidity and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
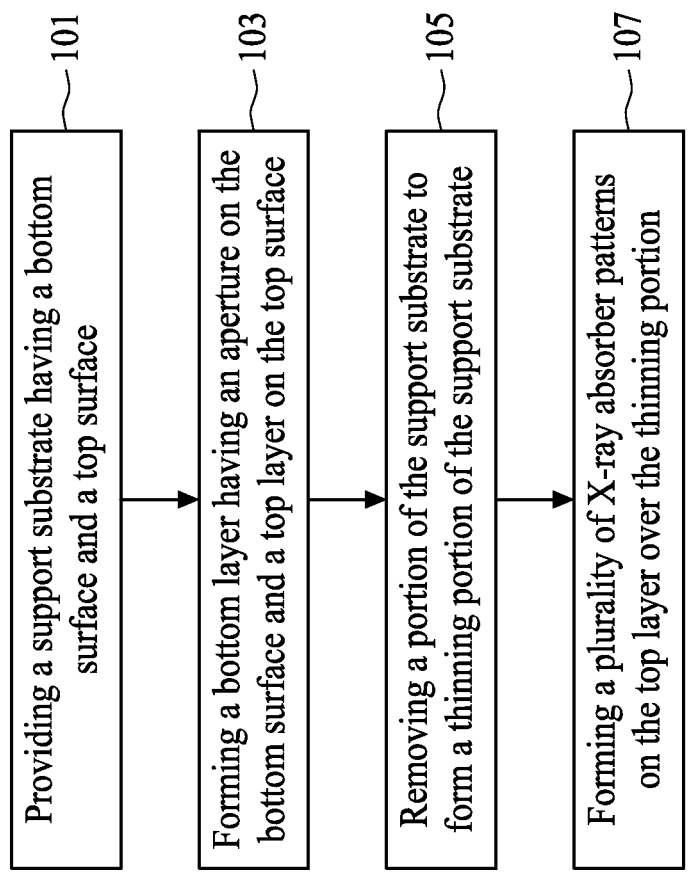
FIG. 1 is a flow chart of a method providing a high-level overview of a process for preparing an X-ray mask structure with high precision and high rigidity in accordance with embodiments of the inventive arrangements disclosed herein.

FIG. 1 is a flow chart of a method 100 providing a high-level overview of a process for preparing an X-ray mask structure with high precision and high rigidity in accordance with embodiments of the inventive arrangements disclosed herein.

A method 100 can begin in step 101 to provide a support substrate having a bottom surface and a top surface. Materials of the support substrate can include, but are not limited to, silicon, glass, quartz, or combinations thereof.

In step 103, a deposition process can be performed to form a top layer on the top surface and a bottom layer having an aperture on the bottom surface. In some embodiments of the present disclosure, a deposition process such as a chemical vapor deposition (CVD) process is used to form the top layer and the bottom layer, and lithographic and etching processes are then used to form the aperture of the bottom layer. Materials of the top and bottom layers can include, but are not limited to, beryllium, titanium, silicon, graphite, nitride, oxide, or carbide.

In step 105, a portion of the support substrate is removed from the aperture of the bottom layer to form a thinned portion of the support substrate. In some embodiments of the present disclosure, the bottom layer having the aperture is used as the etching mask in an etching process, such as chemical etching, plasma etching, laser ablation, mechanical machining or the combination thereof, to form the thinned portion of the support substrate.

In some embodiments of the present disclosure, the removing of a portion of the support substrate forms a laminated membrane consisting substantially of the top layer and the thinned portion, wherein the thinned portion has a thickness substantially between 0.01 and 100 µm, and the top layer has a thickness substantially between 10 nm and 10 µm.

In some embodiments of the present disclosure, the removing of a portion of the support substrate forms a depression on the bottom surface of the support substrate, and the depression is surrounded by a wall portion of the support substrate, wherein the removing of a portion of the support substrate forms the depression without penetrating through the support substrate. In some embodiments of the present disclosure, the removing of a portion of the support substrate that forms the thinned portion is surrounded by the wall portion of the support substrate.

In step 107, a plurality of X-ray absorber patterns are formed on the top layer over the thinned portion. In some embodiments of the present disclosure, the forming of the plurality of X-ray absorber patterns is performed by electroplating, mechanical machining, deposition, laser ablation, printing, or particle beam machining. Materials of the plurality of X-ray absorber patterns can include, but are not limited to, gold, platinum, tungsten, hafnium, tantalum, lead, or the combination thereof.

In some embodiments of the present disclosure, the forming of the plurality of X-ray absorber patterns comprises forming a seeding layer on the top layer, a resist layer having a plurality of openings on the seeding layer over the thinned portion, and the plurality of X-ray absorber patterns are formed in the plurality of openings over the thinned portion.

FIG. 2 to FIG. 9 show an illustrated process flow depicting the process for preparing an X-ray mask structure 10 with high precision and high rigidity in accordance with embodiments of the inventive arrangements disclosed herein. Process flow can represent a specific embodiment of the method 100.

Figure 2:
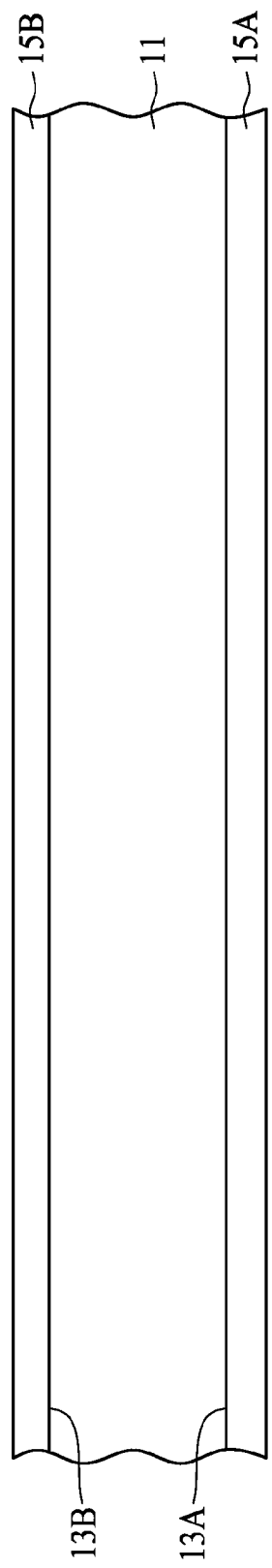
FIG. 2 is a cross-sectional view showing a top layer and a bottom layer formed on a support substrate in accordance with embodiments of the inventive arrangements disclosed herein.

Referring to FIG. 2, in some embodiments of the present disclosure, a silicon substrate 11 is polished on the bottom surface 13A and the bottom surface 13B, and a cleaning process is performed on the top and bottom surfaces of the silicon substrate. Subsequently, a deposition process, such as a chemical vapor deposition (CVD) process, is used to form a bottom layer 15A on the bottom surface 13A and a top layer 15B on the top surface 13B, respectively. In some embodiments of the present disclosure, the bottom layer 15A and the top layer 15B are made of silicon nitride with a thickness substantially of about 0.5 µm, and the left and right sides of the silicon substrate 11 can be covered by silicon nitride.

Figure 3:
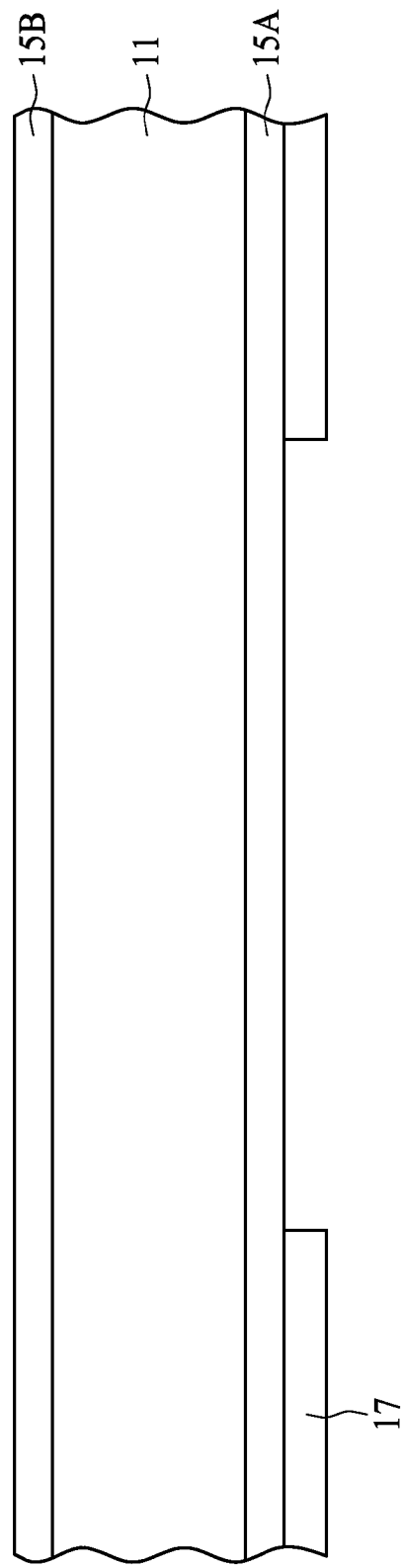
FIG. 3 is a cross-sectional view showing a patterned resist layer formed on the bottom layer in accordance with embodiments of the inventive arrangements disclosed herein.
Figure 4:
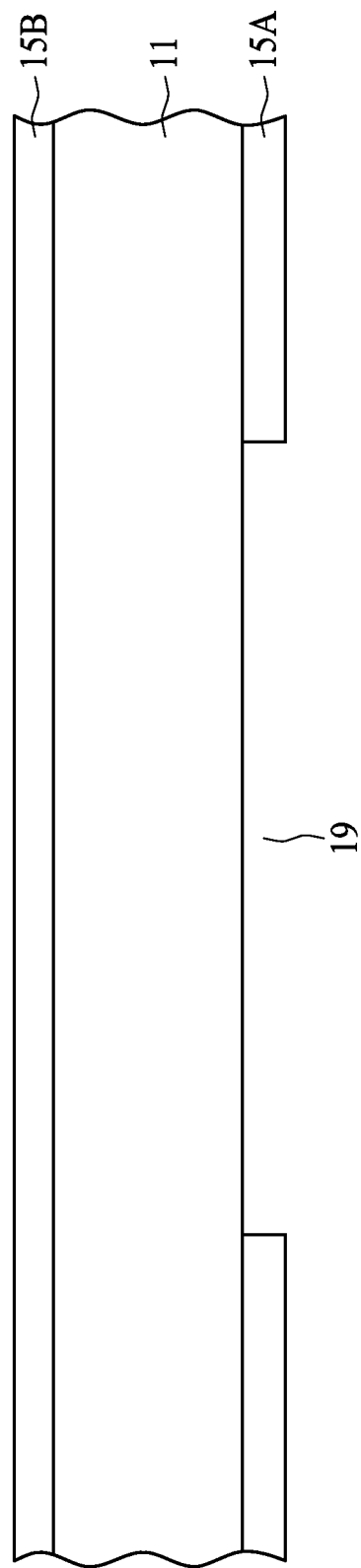
FIG. 4 is a cross-sectional view showing an aperture formed in the bottom layer in accordance with embodiments of the inventive arrangements disclosed herein.

Referring to FIG. 3, spin coating and lithographic processes are performed to form a patterned resist layer 17 on the bottom layer 15A. Subsequently, an etching process is then performed to remove a portion of the bottom layer 15A not covered by the patterned resist layer 17 so as to form an aperture 19 of the bottom layer 15A, and the patterned resist layer 17 is then stripped, as shown in FIG. 4. In some embodiments of the present disclosure, the etching process is a dry etching process, such as the plasma etching process, and the aperture 19 of the bottom layer 15A exposes a central portion of the support substrate 11.

Figure 5:
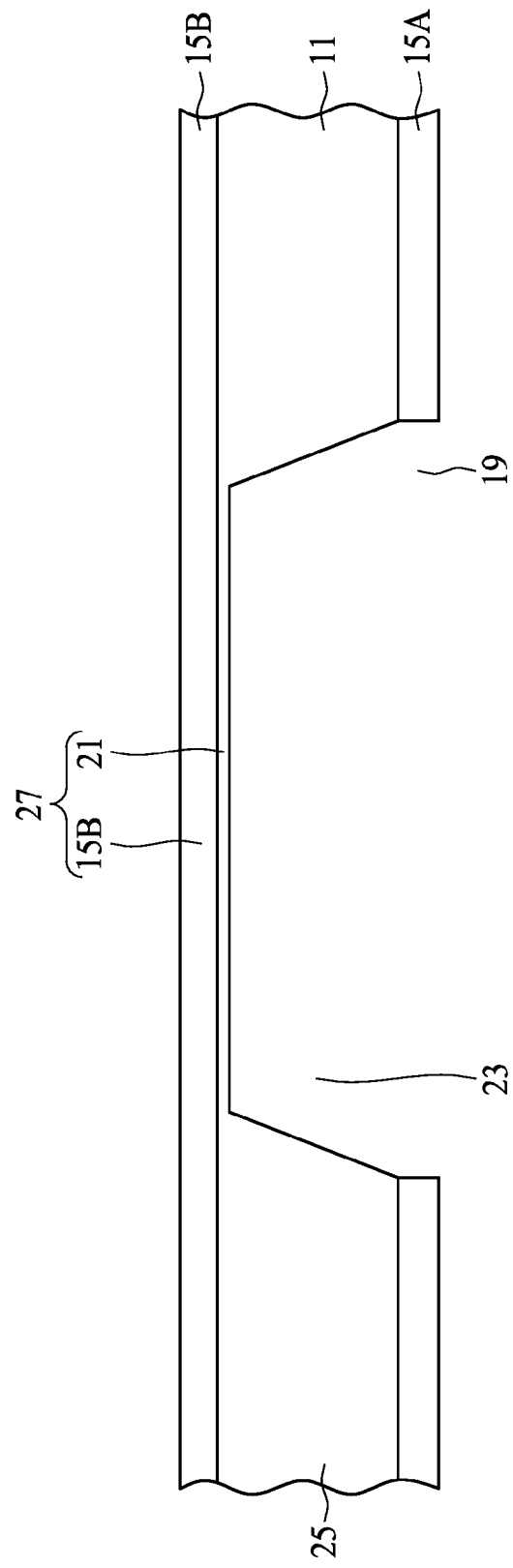
FIG. 5 is a cross-sectional view showing a thinned portion and a wall portion formed in the support substrate in accordance with embodiments of the inventive arrangements disclosed herein.

Referring to FIG. 5, another etching process is performed to remove a portion of the support substrate 11 from the aperture 19 of the bottom layer 15A to form a depression 23 in the bottom portion of the support substrate 11, and the depression 23 is surrounded by a wall portion 25 of the support substrate 11. In some embodiments of the present disclosure, the etching process is an anisotropic wet etching process using a potassium hydroxide (1M, 60° C.) solution, and the bottom layer 15A having the aperture 19 is used as the etching mask. The etching solution is agitated from a uniform etching rate, and the etching process is carefully controlled and monitored to form a thinned portion 21 such that the thickness of the thinned portion 21 is smaller than that of the wall portion 25.

The removing of a portion of the support substrate 11 forms the depression 23 without penetrating through the support substrate 11, thereby forming the thinned portion 21 surrounded by the wall portion 25 of the support substrate 11. In some embodiments of the present disclosure, the removing of a portion of the support substrate 11 forms a laminated membrane 27 consisting substantially of the top layer 15B and the thinned portion 21, wherein the thinned portion 21 has a thickness substantially of about 3.0 µm and the top layer has a thickness substantially of about 0.5 µm.

Figure 6:
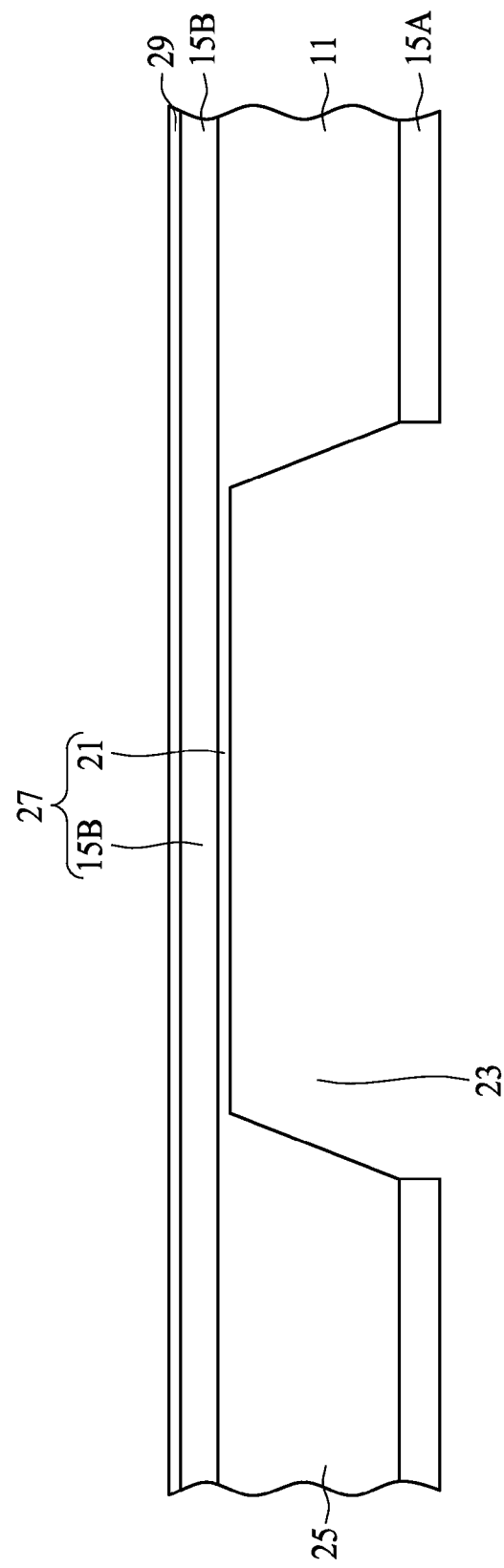
FIG. 6 is a cross-sectional view showing a seeding layer formed on the top layer in accordance with embodiments of the inventive arrangements disclosed herein.

Referring to FIG. 6, after performing cleaning and drying processes, a seeding layer 29 is formed on the top layer 15B by a deposition process, such as the sputtering process. In some embodiments of the present disclosure, the seeding layer 29 is a gold layer and has a thickness substantially of about 50 nm.

Figure 7:
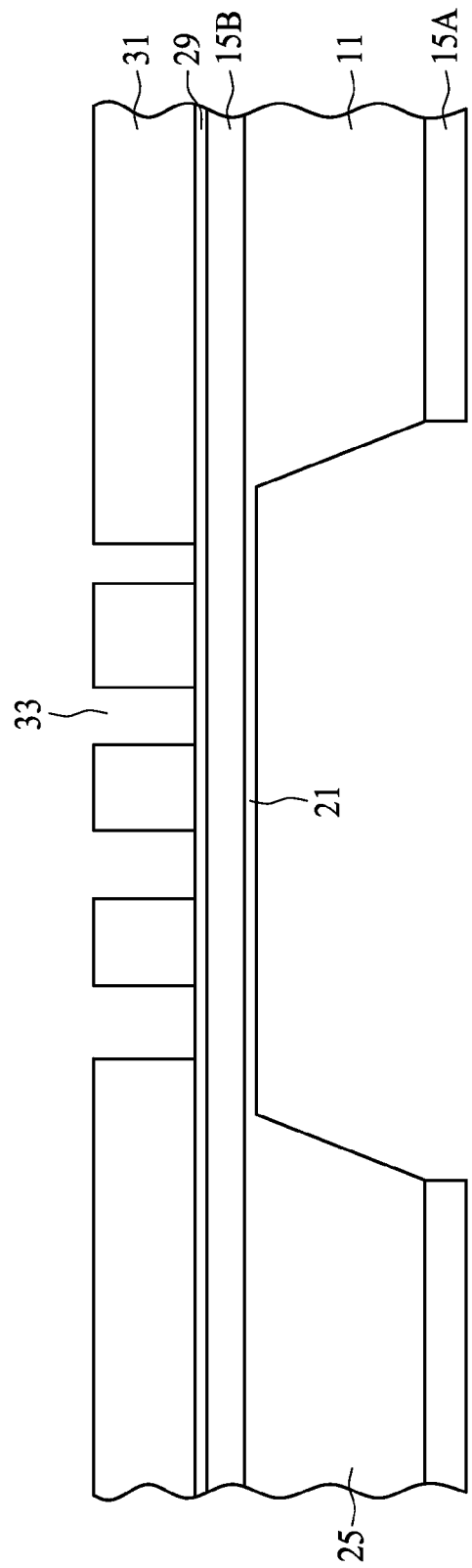
FIG. 7 is a cross-sectional view showing a patterned resist layer with a plurality of openings formed over the thinned portion of the support substrate in accordance with embodiments of the inventive arrangements disclosed herein.

Referring to FIG. 7, spin coating and lithographic processes are performed to form a patterned resist layer 31 on the top layer 15B, wherein the patterned resist layer 31 has a plurality of openings 33 over the thinned portion 21 of the support substrate 11.

Figure 8:
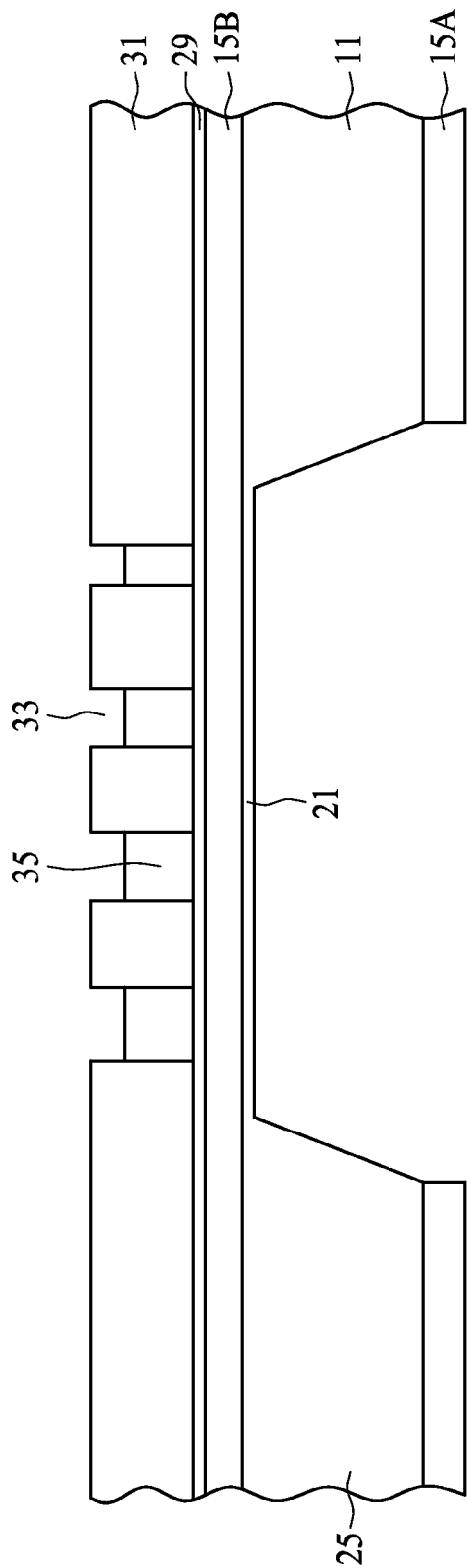
FIG. 8 is a cross-sectional view showing a plurality of X-ray absorber patterns formed in the plurality of openings of the patterned resist layer in accordance with embodiments of the inventive arrangements disclosed herein.
Figure 9:
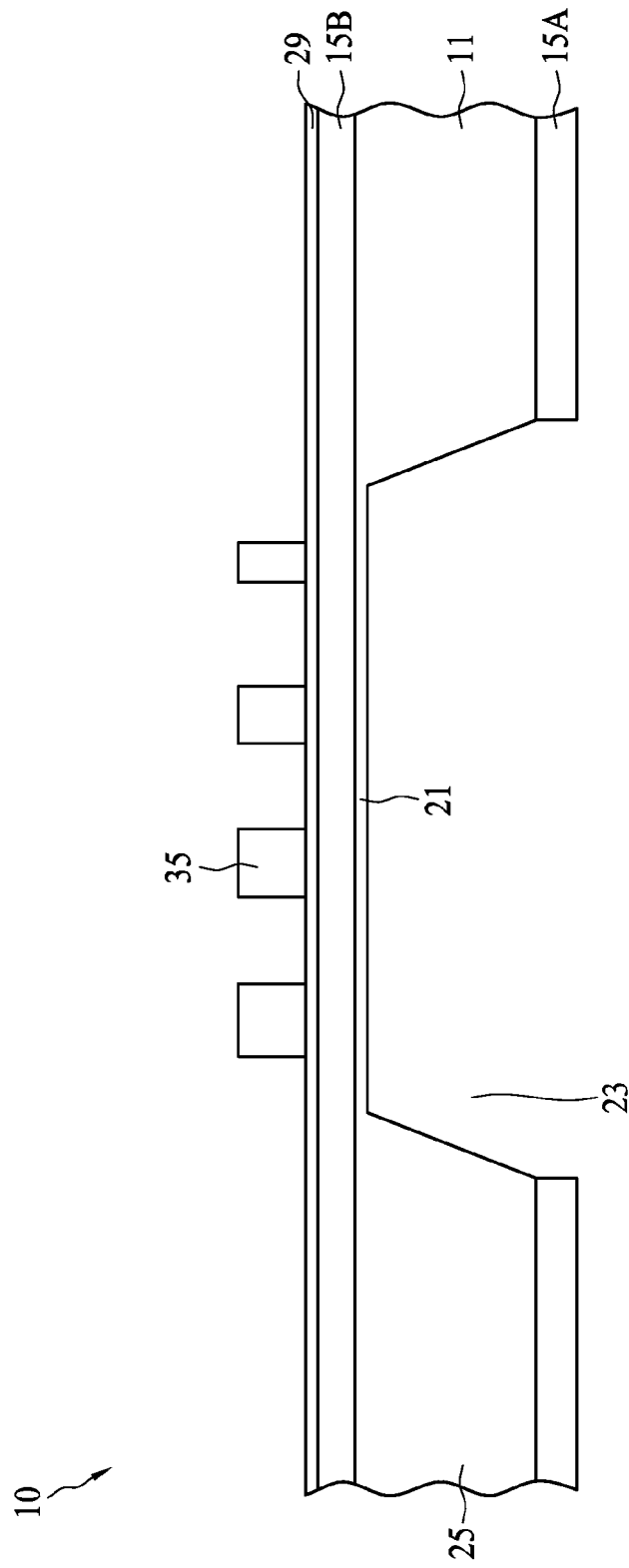
FIG. 9 is a cross-sectional view showing the stripping of the patterned resist layer to form an X-ray mask structure in accordance with embodiments of the inventive arrangements disclosed herein.

Referring to FIG. 8, an electroplating process is performed to form a plurality of X-ray absorber patterns 35 in the plurality of openings 33 of the patterned resist layer 31. Subsequently, the patterned resist layer 31 can be optionally stripped, as shown in FIG. 9. In some embodiments of the present disclosure, a portion of the seeding layer 29 not covered by the plurality of X-ray absorber patterns 35 may be removed to increase the X-ray propagating through this portion so as to provide high exposure contrast.

In some embodiments of the present disclosure, the plurality of X-ray absorber patterns 35 has a thickness substantially between 4.0 and 20.0 µm. Materials of the plurality of X-ray absorber patterns 35 can include, but are not limited to, gold, platinum, tungsten, hafnium, tantalum, lead, or the combination thereof.

Figure 10:
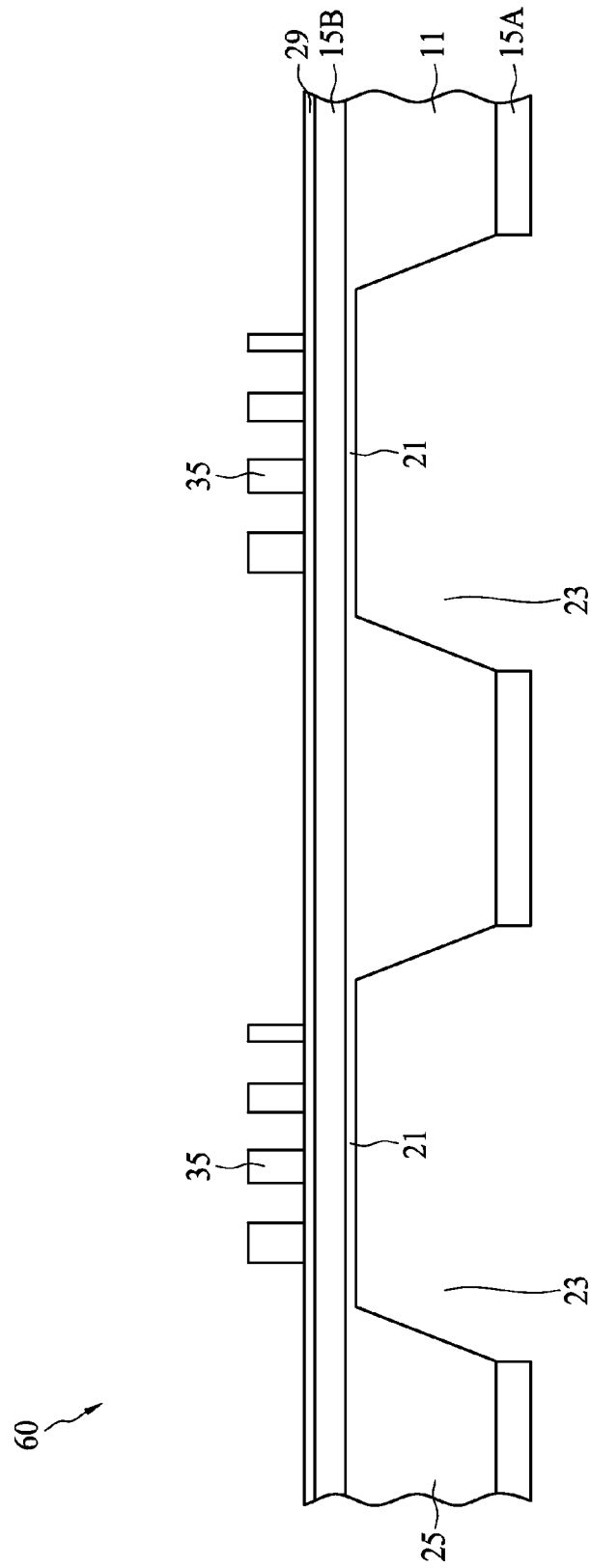
FIG. 10 is a cross-sectional view showing an X-ray mask structure in accordance with embodiments of the inventive arrangements disclosed herein.

FIG. 10 is a cross-sectional view showing an X-ray mask structure 60 in accordance with embodiments of the inventive arrangements disclosed herein. In some embodiments of the present disclosure, a plurality of apertures 19 may be formed in the bottom layer 15A, and the etching process in FIG. 4 may be performed to remove a plurality of portions of the support substrate 11 from the plurality of apertures 19 of the bottom layer 15A to form a plurality of thinned portions 21 and depressions 23 in the bottom portion of the support substrate 11. Subsequently, the fabrication processes described in FIG. 5 to FIG. 9 are performed such that the support substrate 11 may have a plurality of thinned portions 21 and depressions 23, and a plurality of groups of X-ray absorber patterns 35 may be formed over the respective thinned portion 21 of the support substrate 11. In some embodiments of the present disclosure, the layout of the X-ray absorber patterns 35 in one group may be different from the layout of the X-ray absorber patterns 35 in another group.

In some embodiments of the present disclosure, the thinned portion 21 and the wall portion 25 form the unibody support substrate 11, which can provide mechanical support for the top layer 15B. By contrast, if the etching process in FIG. 5 forms the depression 23 penetrating through the support substrate 11, i.e., if there is no thinned portion below the top layer 15B, the wall portion 25 alone may not be able to provide enough mechanical support for the top layer 15B. As a result, the top layer 15B is very fragile due to its residual stress and growth defects. In other words, the X-ray mask structure 10 of the present disclosure has an increased rigidity due to the thinned portion 21 and the wall portion 25 forming the unibody support substrate 11.

Furthermore, the laminated membrane 27, consisting substantially of the top layer 15B and the thinned portion 21, provides mechanical support for the plurality of X-ray absorber patterns 35. The thinned portion 21 of the unibody support substrate 11 can give a very stable mechanical property, and the deposited top layer 15B made of silicon nitride can provide excellent chemical resistance and strengthened mechanical properties. In practice, the yield and rigidity of the laminated membrane 27 is at least one order higher than that of a single-layer membrane of pure silicon nitride (there is no thinned portion below the top layer 15B in case that the etching process in FIG. 5 forms the depression 23 penetrating through the support substrate 11).

In X-ray lithography, high energy synchrotron X-rays are used as the light source. The precision of transferred patterns is highly dependent on the quality of the mask. Since X-rays will be substantially absorbed by all of the materials, the mask membrane should be thin with low-Z (atomic weight) materials ($Si_3N_4$, SiC, Be, etc.), while the mask absorber should be thick enough with high-Z materials (Au, W, Pt, etc.) to provide high exposure contrast. In the X-ray mask structure 10 of the present disclosure, the increased mechanical support of the laminated membrane 27 allows the X-ray absorber patterns 35 thereon to be formed with increased thickness, which can provide increased precision of transferred patterns in X-ray lithography.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing an X-ray mask structure, comprising:
   providing a support substrate having a top surface and a bottom surface;
   forming a top layer on the top surface and a bottom layer having an aperture on the bottom surface;
   removing a portion of the support substrate exposed by the aperture of the bottom layer to form at least one thinned portion of the support substrate, the thinned portion being surrounded by a wall portion being made of the same dopant-free material as the thinned portion; and forming a plurality of X-ray absorber patterns on the top layer over the at least one thinned portion.

2. The method for preparing an X-ray mask structure of claim 1, wherein the removing of the portion of the support substrate forms a laminated membrane consisting substantially of the top layer and the at least one thinned portion.

3. The method for preparing an X-ray mask structure of claim 1, wherein the removing of the portion of the support substrate forms at least one depression on the bottom surface of the support substrate, and the at least one depression is surrounded by the wall portion of the support substrate.

4. The method for preparing an X-ray mask structure of claim 3, wherein the removing of the portion of the support substrate forms the at least one depression without penetrating through the support substrate.

5. The method for preparing an X-ray mask structure of claim 3, wherein the removing of the portion of the support substrate forms the at least one thinned portion surrounded by the wall portion of the support substrate.

6. The method for preparing an X-ray mask structure of claim 1, wherein the removing of the portion of the support substrate comprises performing a chemical etching, a plasma etching, a laser ablation, a mechanical machining, or the combination thereof.

7. The method for preparing an X-ray mask structure of claim 1, wherein the support substrate comprises silicon, glass, quartz, or combinations thereof.

8. The method for preparing an X-ray mask structure of claim 1, wherein the top layer comprises beryllium, titanium, silicon, graphite, nitride, oxide, or carbide.

9. The method for preparing an X-ray mask structure of claim 1, wherein the at least one thinned portion has a thickness between 0.01 and 100 µm.

10. The method for preparing an X-ray mask structure of claim 1, wherein the top layer has a thickness between 10 nm and 10 µm.

11. The method for preparing an X-ray mask structure of claim 1, wherein the plurality of X-ray absorber patterns comprise gold, platinum, tungsten, hafnium, tantalum, lead, or the combination thereof.

12. The method for preparing an X-ray mask structure of claim 1, wherein the forming of the plurality of X-ray absorber patterns comprises performing an electroplating, a mechanical machining, a deposition, a laser ablation, a printing, or a particle beam machining.

13. The method for preparing an X-ray mask structure of claim 1, wherein the forming of the plurality of X-ray absorber patterns comprises forming a seeding layer on the top layer.

14. The method for preparing an X-ray mask structure of claim 1, wherein the forming of the plurality of X-ray absorber patterns comprises forming a resist layer having a plurality of openings over the at least one thinned portion, and the plurality of X-ray absorber patterns are formed in the plurality of openings.

15. The method for preparing an X-ray mask structure of claim 1, wherein the removing of the portion of the support substrate forms a plurality of thinned portions.

16. The method for preparing an X-ray mask structure of claim 1, wherein the removing of the portion of the support substrate forms a plurality of depressions on the bottom surface of the support substrate, and the plurality of depressions are surrounded by the wall portion of the support substrate.

17. An X-ray mask structure, comprising:
a unibody support substrate having at least one thinned portion surrounded by a wall portion, the wall portion and the thinned portion being made of the same dopant-free material;
a top layer disposed on the at least one thinned portion of the support substrate, wherein the top layer and the at least one thinned portion form a laminated membrane; and
a plurality of X-ray absorber patterns disposed on the top layer over the at least one thinned portion;
wherein the at least one thinned portion and the wall portion provide mechanical support for the top layer, and the laminated membrane provides mechanical support for the plurality of X-ray absorber patterns.

18. The X-ray mask structure of claim 17, wherein the unibody support substrate has at least one depression without penetrating through the support substrate, and the at least one depression is surrounded by the wall portion.

19. The X-ray mask structure of claim 17, wherein the at least one thinned portion has a thickness between 0.01 and 100 µm.

20. The X-ray mask structure of claim 17, wherein the top layer has a thickness between 10 nm and 10 µm.

21. The X-ray mask structure of claim 17, wherein the support substrate comprises silicon, glass, quartz, or combinations thereof.

22. The X-ray mask structure of claim 17, wherein the top layer comprises beryllium, titanium, silicon, graphite, nitride, oxide, or carbide.

23. The X-ray mask structure of claim 17, wherein the plurality of X-ray absorber patterns are formed of gold, platinum, tungsten, hafnium, tantalum, lead, or the combination thereof.

24. The X-ray mask structure of claim 17, further comprising a seeding layer disposed on the top layer, and the plurality of X-ray absorber patterns are disposed on the seeding layer.

25. The X-ray mask structure of claim 17, wherein the unibody support substrate has a plurality of thinned portions.

26. The X-ray mask structure of claim 25, comprising a plurality of groups of X-ray absorber patterns disposed on the top layer over the plurality of thinned portions.

27. The X-ray mask structure of claim 17, wherein the unibody support substrate has a plurality of depressions.

\* \* \* \* \*